United States Patent [19]
Fiedler et al.

[11] Patent Number: 5,805,089
[45] Date of Patent: Sep. 8, 1998

[54] TIME-DIVISION DATA MULTIPLEXER WITH FEEDBACK FOR CLOCK CROSS-OVER ADJUSTMENT

[75] Inventors: Alan S. Fiedler, Minneapolis, Minn.; Shoba Krishnan, Fremont, Calif.

[73] Assignee: LSI Logic Corporation, Milpitas, Calif.

[21] Appl. No.: 734,691

[22] Filed: Oct. 21, 1996

Related U.S. Application Data

[60] Provisional application No. 60/025,456 Sep. 5, 1996.
[51] Int. Cl.[6] ....................................................... H03M 9/00
[52] U.S. Cl. ................................................................ 341/101
[58] Field of Search ..................................... 341/101, 100; 340/870.13

[56] References Cited

U.S. PATENT DOCUMENTS

| | | | |
|---|---|---|---|
| 3,358,082 | 12/1967 | Helm | 178/50 |
| 3,395,250 | 7/1968 | Lien | 179/15 |
| 3,914,552 | 10/1975 | Neufang | 370/385 |
| 3,914,553 | 10/1975 | Melindo et al. | 179/15 |
| 4,027,301 | 5/1977 | Mayer | 340/183 |
| 4,157,458 | 6/1979 | Roche | 179/15 |
| 4,445,215 | 4/1984 | Svendsen | 370/100 |
| 4,728,930 | 3/1988 | Grote et al. | 340/347 |
| 4,750,149 | 6/1988 | Miller | 364/900 |
| 4,901,076 | 2/1990 | Askin et al. | 341/100 |
| 4,965,797 | 10/1990 | Yamane et al. | 370/112 |
| 5,025,257 | 6/1991 | Hartley et al. | 341/101 |
| 5,175,819 | 12/1992 | Le Ngoc | 395/250 |
| 5,247,652 | 9/1993 | Uda | 395/500 |
| 5,349,653 | 9/1994 | Kurokawa et al. | 395/500 |
| 5,463,630 | 10/1995 | Tooher | 370/112 |
| 5,526,360 | 6/1996 | Kraft | 371/112 |

*Primary Examiner*—Brian K. Young
*Attorney, Agent, or Firm*—Westman, Champlin & Kelly, P.A.

[57] ABSTRACT

A time-division data multiplexer has feedback for adjusting the select clock cross-over voltage. The multiplexer includes a multi-phase clock generator having a plurality of select clock outputs with different phases, a plurality of parallel data inputs and first and second serial data outputs. A first set of gating transistors is coupled between the first data output and a common node. Each transistor in the first set is gated by a corresponding data input and at least one corresponding select clock output. A second set of gating transistors is coupled between the second data output and the common node. Each transistor in the second set is gated by a corresponding data input and at least one corresponding select clock output. A first current source is coupled to the common node. An amplifier has a first input which is coupled to the common node, a second input which is coupled to a reference voltage generator and a cross-over control output which is coupled to the plurality of select clock outputs for adjusting the cross-over voltage of the select clock outputs in response to a comparison of the voltages on the first and second amplifier inputs. A loop filter is coupled to the cross-over control output.

20 Claims, 8 Drawing Sheets

TIME-DIVISION DATA MULTIPLEXER WITH FEEDBACK FOR CLOCK CROSS-OVER ADJUSTMENT

CROSS REFERENCE TO RELATED APPLICATIONS

This application claims priority from U.S. Provisional application Ser. No. 60/025,456, filed Sep. 5, 1996 and entitled TIME DIVISION DATA MULTIPLEXER WITH FEEDBACK FOR CLOCK CROSS OVER ADJUSTMENT.

Cross reference is made to co-pending application U.S. Ser. No. 08/614,403, filed Mar. 12, 1996 and entitled HIGH PERFORMANCE N:1 MULTIPLEXER WITH OVERLAP CONTROL OF MULTI-PHASE CLOCKS and to co-pending U.S. application Ser. No. 08/698,306, filed Aug. 15, 1996 and entitled DIFFERENTIAL-TO-CMOS LEVEL CONVERTER HAVING CROSS-OVER VOLTAGE ADJUSTMENT, which are assigned to the same assignee.

BACKGROUND OF THE INVENTION

The present invention relates to a data serializer and, in particular, to a time-division data multiplexer having feedback for adjusting the cross-over of multi-phase clocks.

A time-division data multiplexer sequentially multiplexes a plurality of parallel data inputs to a single output for converting the parallel data inputs into a serial data stream. The sequential selection of data inputs is controlled by a clock circuit which may have one or more phases. A typical multi-phase clock circuit in an n:1 multiplexer generates n/2 pairs of select clock signals. The select clock signals in each pair are approximately 180 degrees out of phase with one another. The n select clock signals are equally distributed in phase over 360 degrees. The clock signals are arranged to select individual data inputs in a particular order. A ring oscillator is typically used to generate the clock signals.

The characteristics of the clock signals are critical design concern for multiplexers that are used in high speed digital systems. Clock frequency is one factor which determines the rate of data transmission. The higher the frequency, the higher the rate at which data can be transmitted. In a data serializer using a multi-phase clock, clock duty cycle affects the performance of the serializer. A substantially 50% duty cycle results in an accurate transition from a serializer state during which a first data input is transmitted to the output to a state during which a second data input is transmitted to the output. The simplest way of obtaining a clock having a fifty percent duty cycle in an integrated circuit is to very carefully size the transistors in the clock generation circuit and to use a circuit having a bandwidth significantly higher than the clock frequency. However, for clock frequencies near or above the clock circuit's or serializer's bandwidth, the clock duty cycle and the serializer's performance will be unacceptably sensitive to variations in process, voltage and temperature. A variation in clock duty cycle also manifests itself in a variation in the cross-over point of clock signals 180 degrees apart in phase.

Cross-over points of clock signals that are 180 degrees apart in phase is a concern because the cross-over affects the closeness in time at which successive data samples can be multiplexed. The cross-over points can occur at a voltage that is above or below the optimum level. In an AND-type multiplexer, for example, if the clock signals cross over too high, more than one of the output gates in the multiplexer will be enabled simultaneously, which results in current or voltage spikes in the multiplexed data. If the clock signals cross over too low, there will be a brief period during which none of the output gates will be enabled, which also results in current or voltage spikes in the multiplexed data. These current or voltage spikes will distort the signal at the multiplexer output and will reduce the maximum operating frequency of the multiplexer.

SUMMARY OF THE INVENTION

The time-division data multiplexer of the present invention has feedback for adjusting select clock cross-over voltage. The multiplexer includes a multi-phase clock generator having a plurality of select clock outputs with different phases, a plurality of parallel data inputs and first and second serial data outputs. A first set of gating transistors is coupled between the first data output and a common node. Each transistor in the first set is gated by a corresponding data input and at least one corresponding select clock output. A second set of gating transistors is coupled between the second data output and the common node. Each transistor in the second set is gated by a corresponding data input and at least one corresponding select clock output. A first current source is coupled to the common node. An amplifier has a first input which is coupled to the common node, a second input which is coupled to a reference voltage generator and a cross-over control output which is coupled to the plurality of select clock outputs for adjusting the cross-over voltage of the select clock outputs in response to a difference between the voltages on the first and second amplifier inputs.

The reference voltage generator generates a reference voltage on the second input of the amplifier which represents the voltage on the common node when only one of the gating transistors in the first and second sets is enabled. If the average voltage on the common node is less than the reference voltage generated by the reference voltage generator (caused by the select clock outputs crossing over too low), the cross-over control output will increase until the select clock outputs reach an optimum cross-over voltage.

In another embodiment, the average voltage on the first and second data outputs is compared with a reference voltage generated by a second reference generator. The reference voltage represents the average output voltage when only one of the gating transistors in the first and second sets of gating transistors is enabled. The cross-over control output is generated as a function of the comparison.

DETAILED DESCRIPTION OF THE PREFERRED EMBODIMENTS

The time-division data multiplexer of the present invention uses multi-phase clock signals to multiplex parallel input data into a serial data stream by sequentially selecting data bits through a plurality of multiplexer elements. The multiplexer monitors the cross-over voltage between clock phases and adjusts the cross-over through a feedback loop to ensure that there is no time during which all multiplexer elements are off and there is no time during which two multiplexer elements are on at the same time. Thus, the multiplexer transitions cleanly from one bit to the next.

Figure 1:
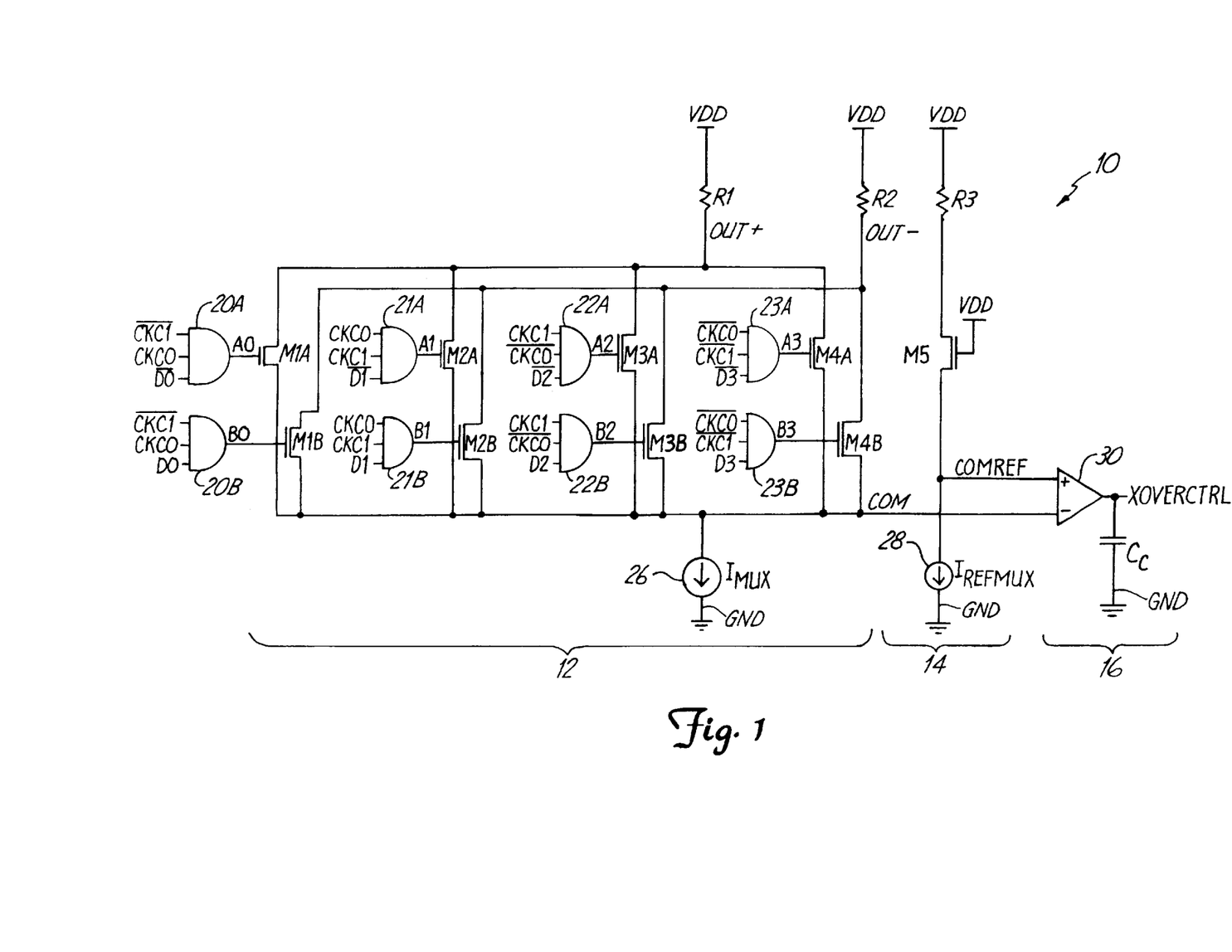
FIG. 1 is a schematic diagram of a time-division data multiplexer with a cross-over control output, in accordance with the present invention.

FIG. 1 is a block diagram of a 4:1 time-division data multiplexer having feedback control of clock cross-over, in accordance with the present invention. Time-division data multiplexer 10 includes data multiplexer portion 12, reference multiplexer portion 14 and feedback portion 16. Data multiplexer portion 12 includes true and complement data inputs D0–D3 and $\overline{D0}$–$\overline{D3}$, multi-phase select clock inputs CKC0, CKC1, $\overline{CKC0}$, $\overline{CKC1}$, data outputs OUT+ and OUT−, a first set of AND gates 20A, 21A, 22A and 23A, a second set of AND gates 20B, 21B, 22B and 23B, a first set of gating transistors M1A, M2A, M3A and M4A, a second set gating transistors M1B, M2B, M3B and M4B, a tail current source 26 and load resistors R1 and R2.

AND gate 20A has its three inputs coupled to data input $\overline{D0}$ and select clock inputs CKC0 and $\overline{CKC1}$, and has an output A0 which is coupled to the gate of transistor M1A. AND gate 21A has its three inputs coupled to data input $\overline{D1}$ and select clock inputs CKC1 and CKC0, and has an output A1 coupled to the gate of transistor M2A. AND gate 22A has its three inputs coupled to data input $\overline{D2}$ and select clock inputs $\overline{CKC0}$ and CKC1, and has an output A2 coupled to the gate of transistor M3A. AND gate 23A has its three inputs coupled to data input $\overline{D3}$ and select clock inputs $\overline{CKC1}$ and $\overline{CKC0}$, and has an output A3 which is coupled to the gate of transistor M4A.

AND gate 20B has its three inputs coupled to data input D0 and select clock inputs CKC0 and $\overline{CKC1}$, and has an output B0 which is coupled to the gate of transistor M1B. AND gate 21B has its three inputs coupled to data input D1 and select clock inputs CKC1 and CKC0, and has an output B1 which is coupled to the gate of transistor M2B. AND gate 22B has its three inputs coupled to data input D2 and select clock inputs $\overline{CKC0}$ and CKC1, and has an output B2 which is coupled to the gate of transistor M3B. AND gate 23B has its three inputs coupled to data input D3 and select clock inputs $\overline{CKC1}$ and $\overline{CKC0}$, and has an output B3 which is coupled to the gate of transistor M4B. The outputs of AND gates 20A-23A and 20B–23B form multiplexer select outputs A0–A3 and B0–B3, respectively, which selectively enable gating transistors M1A–M4A and M1B–M4B.

Transistors M1A–M4A and M1B–M4B are N-channel transistors. The drains of transistors M1A–M4A are coupled to data output OUT+. The drains of transistors M1B–M4B are coupled to data output OUT−. The sources of transistors M1A–M4A and M1B–M4B are coupled to common node COM. Tail current source 26 is coupled between common node COM and a relatively negative supply terminal GND. Tail current source 26 supplies a tail current $I_{MUX}$ for transistors M1A–M4A and M1B–M4B. Load resistor R1 is coupled between a relatively positive supply terminal VDD and data output OUT+. Load resistor R2 is coupled between supply terminal VDD and data output OUT−.

During operation, parallel data is applied to true data inputs D0–D3 and complement data inputs $\overline{D0}$–$\overline{D3}$. Select clock inputs CKC0–CKC1 and $\overline{CKC0}$–$\overline{CKC1}$ sequentially invert and connect complement data inputs $\overline{D0}$–$\overline{D3}$ to data output OUT+ and true data inputs D0–D3 to data output OUT−. For example, when both CKC0 and $\overline{CKC1}$ are high, either output A0 or B0 will pulse high depending upon the data on data inputs D0 and $\overline{D0}$. Either transistor M1A or M1B will turn on temporarily and pull the respective data output OUT+ or OUT− low toward the potential at supply terminal GND. In the next bit-time, CKC0 and CKC1 are both high and either output A1 or B1 will pulse high depending upon the data on data inputs D1 and $\overline{D1}$. This process continues for data inputs D2/$\overline{D2}$ and D3/$\overline{D3}$, and the process then repeats.

Reference multiplexer portion 14 includes load resistor R3, reference transistor M5 and tail current source 28. Load resistor R3 is coupled between supply terminal VDD and the drain of reference transistor M5. The gate of reference transistor M5 is coupled to supply terminal VDD, and the source of reference transistor M5 is coupled to reference node COMREF. Tail current source 28 is coupled between reference node COMREF and supply terminal GND. Reference transistor M5 is equivalent to a single gating transistor M1A–M4A and M1B–M4B. Reference transistor M5 is continuously enabled and generates a reference voltage on reference node COMREF which is equal to the voltage on common node COM when one of the gating transistors is continuously enabled.

In one embodiment, load resistor R3 has a resistance which is equal to the resistances of load resistors R1 and R2, reference transistor M5 has a gate width and length which are equal to the gate width and length of transistors M1A–M4A and M1B–M4B and tail current source 28 supplies a tail current $I_{REFMUX}$ which is equal to the tail current $I_{MUX}$ supplied by tail current source 26.

In an alternative embodiment, reference multiplexer portion 14 is scaled according the following relation to save power by a factor of N:

$$R_{REF}=R*N,\ W_{REF}=W/N,\ I_{REFMUX}=I_{MUX}/N \qquad \text{Eq. 1}$$

where:

$R_{REF}$ is the resistance of resistor R3;

R is the resistance of resistors R1 and R2;

$W_{REF}$ is the gate width of transistor M5;

W is the gate width of transistors M1A–M4A and M1–M4B;

$I_{REFMUX}$ is the current supplied by tail current source 28; and $I_{MUX}$ is the current supplied by tail current source 26.

Feedback portion 16 includes differential amplifier 30 and filter capacitor $C_c$. Differential amplifier 30 has a non-inverting input coupled to reference node COMREF, an inverting input coupled to common node COM and a cross-over control output XOVERCTRL. Filter capacitor $C_c$ is coupled between cross-over control output XOVERCTRL and supply terminal GND. Differential amplifier 30 compares the voltages on reference node COMREF and common node COM and generates a feedback signal on cross-over control output XOVERCTRL for adjusting clock cross-over.

Figure 2:
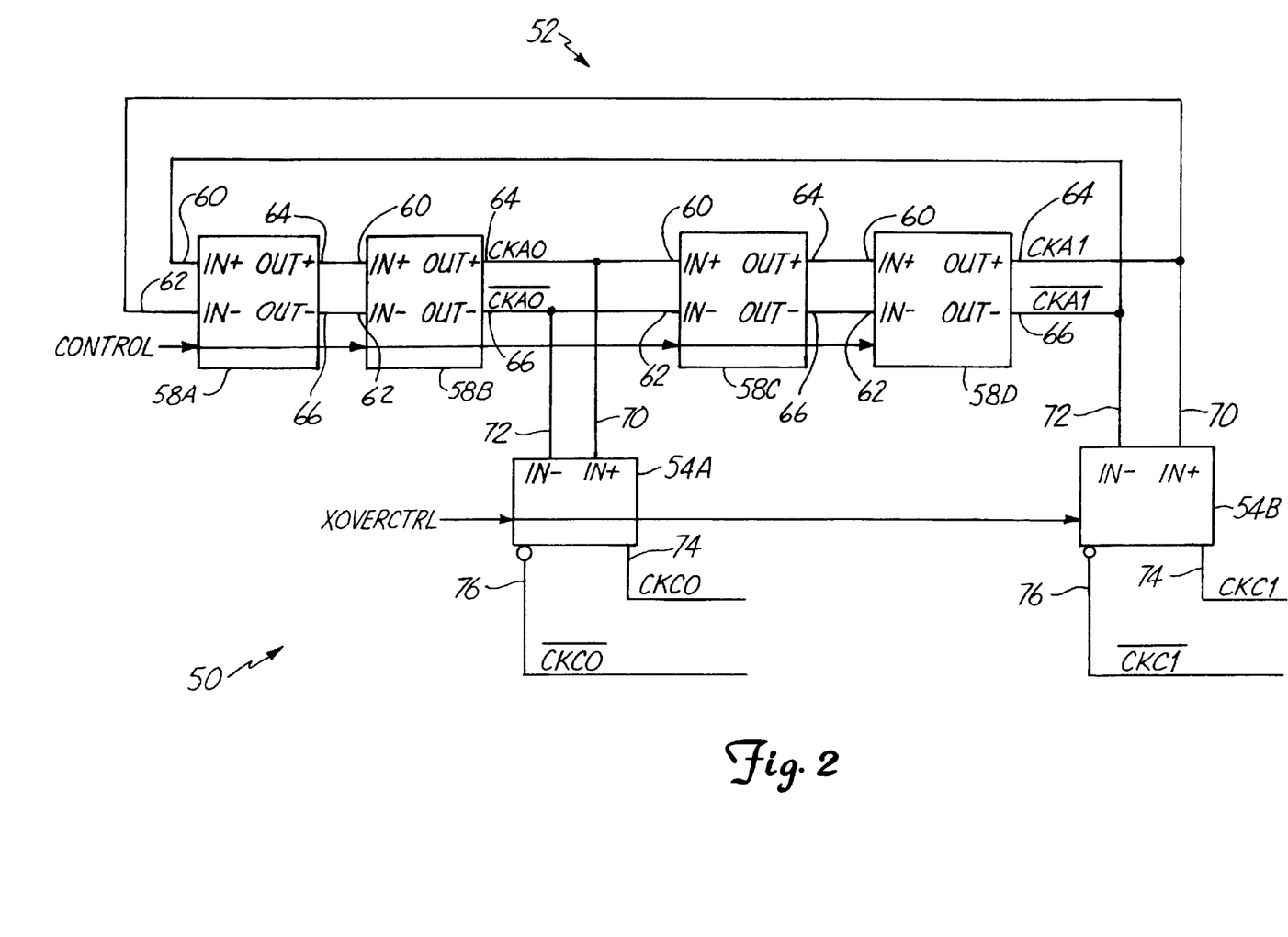
FIG. 2 is a schematic diagram of a multi-phase clock generator having a cross-over control input, in accordance with the present invention.

FIG. 2 is a schematic diagram of a multi-phase clock generator having a cross-over control input according to the present invention. Multi-phase clock generator 50 includes differential voltage-controlled oscillator (VCO) 52 and differential-to-CMOS level buffers 54A and 54B. VCO 52 includes a plurality of VCO delay elements 58A, 58B, 58C and 58D which are connected together in series to form a ring oscillator. Each VCO delay element includes voltage control input CONTROL, differential inputs 60 and 62 and differential outputs 64 and 66. Input 60 is relatively positive with respect to input 62. Output 64 is relatively positive with respect to output 66. Outputs 64 and 66 of element 58A are coupled to inputs 60 and 62, respectively, of element 58B. Outputs 64 and 66 of element SBB are coupled to inputs 60 and 62, respectively, of element 58C. Outputs 64 and 66 of element 58C are coupled to inputs 60 and 62, respectively, of element 58D. Outputs 64 and 66 of element 58D are coupled to inputs 62 and 60, respectively, of element 58A. The polarity of outputs 64 and 66 of element 58D are reversed with respect to the polarity of inputs 60 and 62 of element 58A such that the circuit will oscillate.

The voltage on voltage control input CONTROL controls the delay through each VCO delay element. Outputs 64 and 66 of element 58B form intermediate clock signals CKA0 and $\overline{\text{CKA0}}$ which are coupled to differential inputs 70 and 72, respectively, of differential-to-CMOS level buffer 54A. Outputs 64 and 66 of element 58D form intermediate clock signals CKA1 and $\overline{\text{CKA1}}$ which are coupled to inputs 70 and 72 of differential-to-CMOS level buffer 54B.

Buffers 54A and 54B further include complementary outputs 74 and 76 and an input coupled to cross-over control output XOVERCTRL. Buffers 54A and 54B convert the differential, intermediate clock signals CKA0, $\overline{\text{CKA0}}$, CKA1, and $\overline{\text{CKA1}}$ into "rail-to-rail", CMOS-level, select clock signals CKC0, $\overline{\text{CKC0}}$, CKC1 and $\overline{\text{CKC1}}$389, which are applied to corresponding select clock inputs CKC0, $\overline{\text{CKC0}}$, CKC1 and $\overline{\text{CKC1}}$, shown in FIG. 1. Select clock signals CKC1, $\overline{\text{CKC0}}$ and $\overline{\text{CKC1}}$ have phases relative to select clock signal CKC0 of 90, 180 and 270 degrees, respectively. As described above, these select clock signals are logically "ANDed" with the parallel input data to convert the data into a serial data stream.

Figure 3:
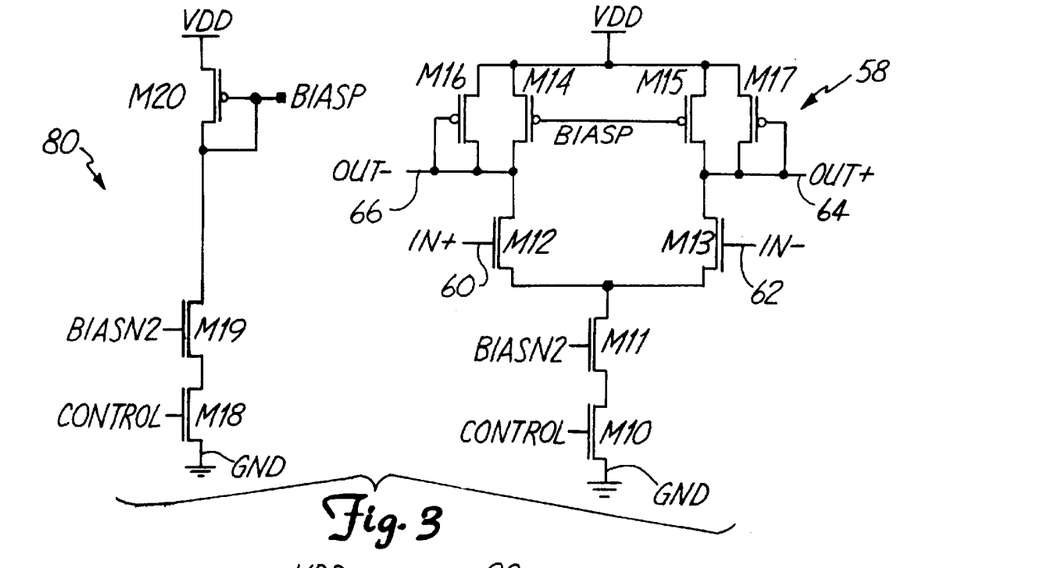
FIG. 3 is a schematic diagram of a VCO delay element used in the multi-phase clock generator shown in FIG. 2.

FIG. 3 is a schematic diagram of one of the VCO delay elements 58A–58D. Also shown in FIG. 3 is a bias circuit which generates a pull-up bias voltage for each of the delay elements. Delay element 58 includes N-channel transistors M10–M13 and P-channel transistors M14–M17. Transistor M10 forms a controlled current source and has a gate coupled to voltage control input CONTROL and source coupled to supply terminal GND. The drain of transistor M10 is coupled to the source of transistor M11. Transistor M11 has a gate coupled to bias input BIASN2 and a drain coupled to the sources transistors M12 and M13. The voltage on bias input BIASN2 is set by a bias circuit (not shown) for maintaining transistor M10 in saturation. Transistors M12 and M13 are coupled together to form a differential transistor pair. The gates of transistors M12 and M13 are coupled to input terminals 60 and 62, respectively. Transistors M14 and M15 are pull-up transistors which are coupled between supply terminal VDD and the drains of transistors M12 and M13 respectively. Transistors M16 and M17 are diode-connected clamp transistors which are coupled between supply terminal VDD and the drains of transistors M14 and M15, respectively. The gates of transistors M14 and M15 are coupled to bias input BIASP.

Bias circuit 80 includes N-channel transistors M18 and M19 and P-channel transistor M20. Transistor M18 has a gate coupled to voltage control input CONTROL, a source coupled to supply terminal GND and a drain coupled to the source of transistor M19. Transistor M19 has a gate coupled to bias input BIASN2 and a drain coupled to the drain and gate of transistor M20. The source of transistor M20 is coupled to supply terminal VDD. The gate of transistor M20 is coupled to the bias input BIASP of each VCO delay element 58A–58D. In a preferred embodiment, transistor M18 has a gate length and width which is equal to the gate length and width of transistor M10; transistor M19 has a gate length and width which is equal to the gate length and width of transistor M11; and transistor M20 has a gate length which is equal to the gate lengths of transistors M14 an M15 and has a gate width which is equal to twice the gate width of transistors M14 and M15.

Current supplied by transistor M10 is directed through transistors M12 and M13 as a function of the relative polarity of the voltages on input terminals 60 and 62. For example, if the voltage on input terminal 60 is relatively positive with respect to the voltage on input terminal 62, the current supplied by transistor M10 is directed through transistor M12. The voltage at the drain of transistor M12 falls until clamp transistor M16 turns on. In steady state, transistors M14 and M16 each conduct approximately one-half of the current supplied by transistor M10. Likewise, if the voltage on input terminal 62 is relatively positive with respect to the voltage on input terminal 60, the current supplied by transistor M10 is directed through transistor M13. The voltage at the drain of transistor M13 falls until clamp transistor M17 turns on, at which time transistors M15 and M17 each conduct approximately one-half of the current supplied by transistor M10. The drains of transistors M12 and M13 form outputs 66 and 64, respectively. VCO delay element 58 is provided as an example only. Numerous other delay elements or circuit configurations can be used in accordance with the present invention.

Figure 4:
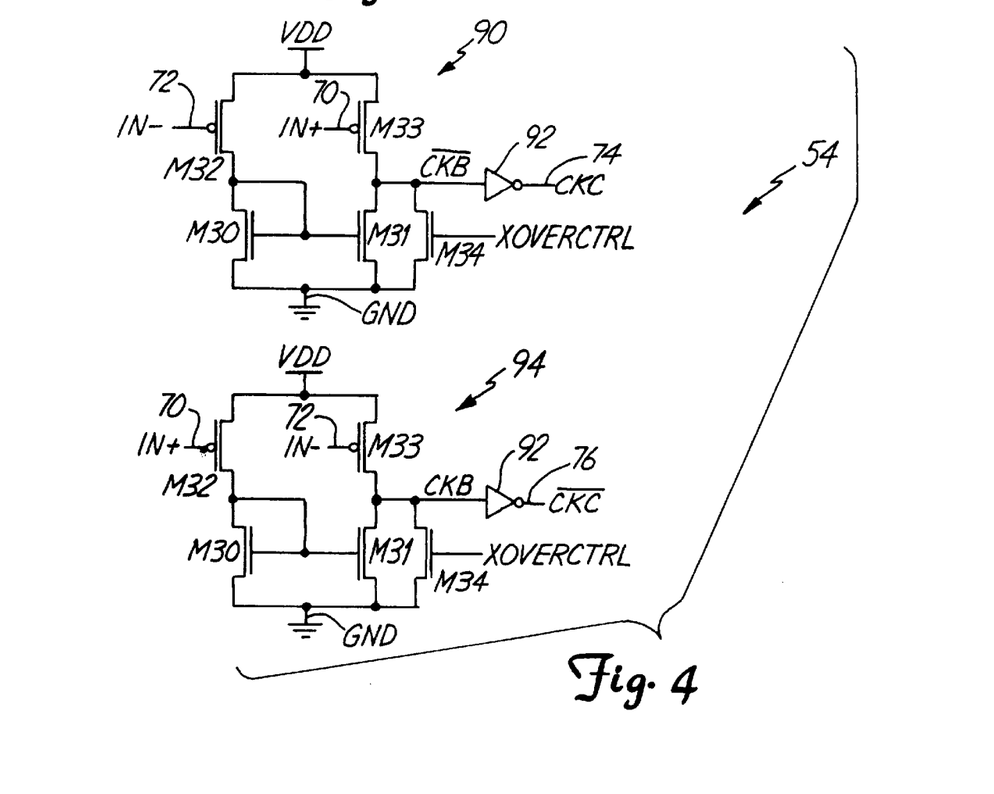
FIG. 4 is a schematic diagram of a differential-to-CMOS level buffer with a cross-over control input, which is used in the multi-phase clock generator shown in FIG. 2.

FIG. 4 is a schematic diagram of one of the differential-to-CMOS level buffers 54A and 54B shown in FIG. 2. Buffer 54 includes two circuit portions, one for generating a select clock signal on true output 74 and one for generating a select clock signal on complement output 76. Circuit portion 90 includes N-channel transistors M30 and M31, P-channel transistors M32 and M33 and inverter 92. Differential inputs 70 and 72 are applied to the gates of transistors M33 and M32, respectively, which are coupled together to form a differential transistor pair with their sources coupled to supply terminal VDD. Transistor M30 has a gate and drain coupled to the gate of transistor M31 and the drain of transistor M32. The sources of transistors M30 and M31 are coupled to supply terminal GND. The drain of transistor M31 is coupled to the drain of transistor M33 and to intermediate select clock node $\overline{\text{CKB}}$. Inverter 92 is coupled between node $\overline{\text{CKB}}$ and output 74.

Circuit portion 90 converts differential clock signals received on inputs 70 and 72 into a "rail-to-rail" CMOS level select clock signal on output 74. Current is directed through transistors M32 and M33 as a function of the relative polarity of the signals applied to differential inputs 70 and 72. When the signal applied to input 70 is relatively positive with respect to the signal applied to input 72, current is directed through transistor M32. Transistors M30 and M31 are coupled together to form a current mirror which mirrors the current flowing through the drain of transistor M32 into the drain transistor M31 and thereby pulls intermediate select clock node $\overline{\text{CKB}}$ low. When the signal applied to input 72 is relatively positive with respect to the signal applied to input 70, current is directed through transistor M33, which pulls intermediate select clock node $\overline{\text{CKB}}$ high.

Circuit portion 94 has a similar structure and operation as circuit portion 90. The same reference numerals are used for circuit portion 94 as were used for circuit portion 90 for the same or similar components. However, the inputs have been reversed, with input 70 being coupled to the gate of transistor M32 and input 72 being coupled to the gate of transistor M33. The select clock signal generated on output 76 is therefore the complement of and 180 degrees out of phase from the select clock signal generated on output 74.

Circuit portions 90 and 94 further include cross-over adjustment transistors M34. In circuit portion 90, transistor M34 has a gate coupled to cross-over control input XOVERCTRL, a source coupled to supply terminal GND and a drain coupled to intermediate select clock node $\overline{\text{CKB}}$. In circuit portion 94, transistor M34 has a gate coupled to cross-over control input XOVERCTRL, a source coupled to supply terminal GND and a drain coupled to intermediate select clock node CKB. Crossover adjustment transistors M34 adjust the rise and fall characteristics of nodes CKB and $\overline{\text{CKB}}$ as a function of the cross-over control input XOVERCTRL to adjust the voltage at which the select clock signals on outputs 74 and 76 cross over one another. For example, increasing the voltage on cross-over control input XOVERCTRL increases the current drawn from nodes CKB and $\overline{\text{CKB}}$, which slows the rise characteristic and speeds the fall characteristic of nodes CKB and $\overline{\text{CKB}}$. This in turn advances the rising edge and delays the falling edge of the inverted select clock signals generated on outputs 74 and 76. As a result, the voltage at which outputs 74 and 76 cross over one another increases.

In a preferred embodiment, under the condition XOVERCTRL=0 V, the transistors in buffers 54A and 54B are sized such that the select clock signals on outputs 74 and 76 always cross over one another at a voltage lower than the optimum value. Therefore, cross-over adjustment transistors M34 are able to increase the cross-over point of CKC and $\overline{\text{CKC}}$ to the optimum voltage by increasing the current drawn from nodes CKB and $\overline{\text{CKB}}$.

In an alternative embodiment (not shown), N-channel transistors M34 are replaced with P-channel transistors having a gate coupled to cross-over control output XOVERCTRL, a source coupled to supply terminal VDD and a drain coupled to nodes CKB and $\overline{\text{CKB}}$. Also, the inputs to amplifier 30 in FIG. 1 are reversed, and filter capacitor $C_c$ is coupled to VDD, as opposed to GND. In this embodiment, the transistors in buffers 54A and 54B are sized such that the select clock signals generated on outputs 74 and 76 always cross over one another at a voltage above the optimum value. Therefore, the cross-over adjustment transistors are able to decrease the cross-over point of CKC and $\overline{\text{CKC}}$ by sourcing additional current into nodes CKB and $\overline{\text{CKB}}$. In yet another alternative embodiment, circuit portions 90 and 94 include a combination of N-channel and P-channel cross-over adjustment transistors which are coupled to nodes CKB and $\overline{\text{CKB}}$.

Figure 5A:
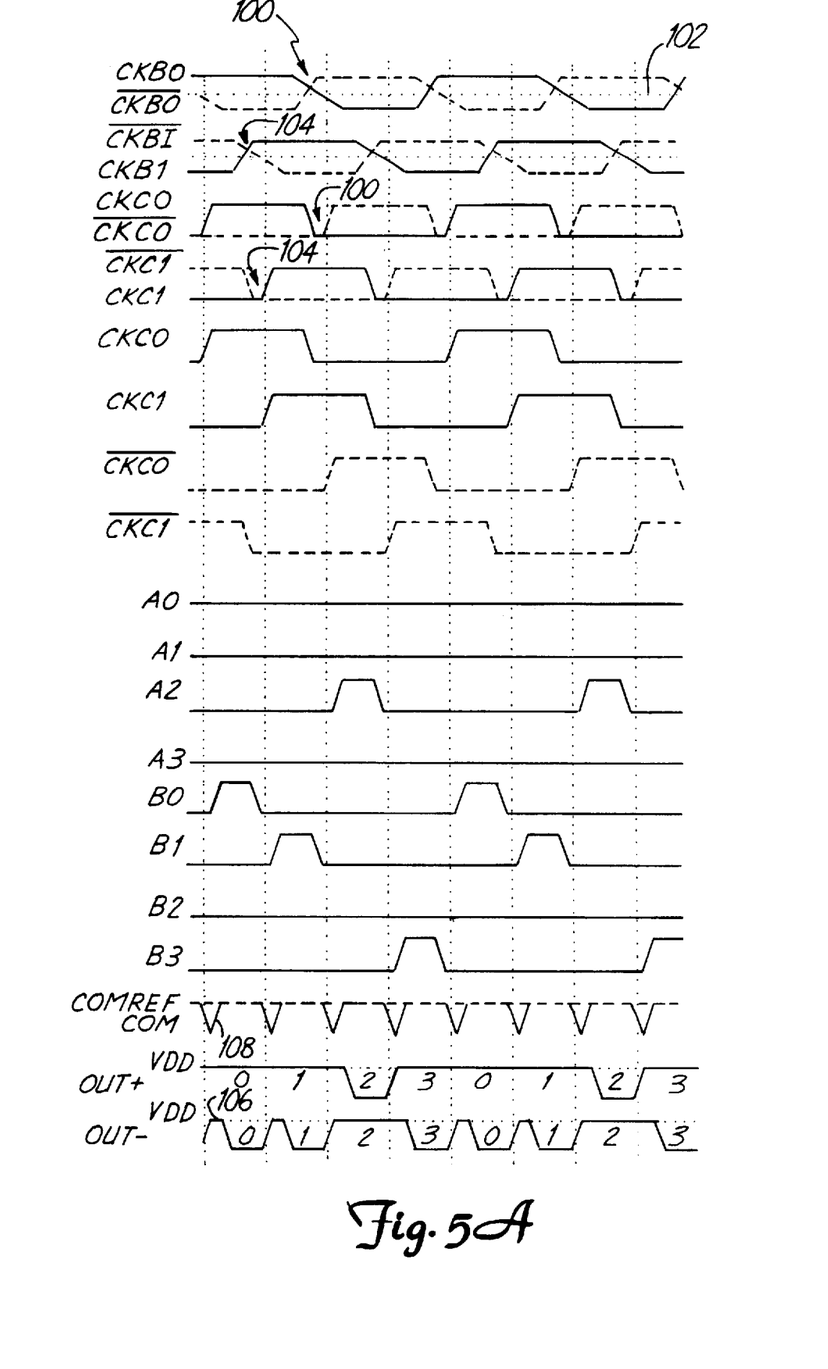
FIG. 5a is a waveform diagram illustrating the waveforms at various nodes in the circuits shown in FIGS. 1–4 when the clocks cross over low.
Figure 5B:
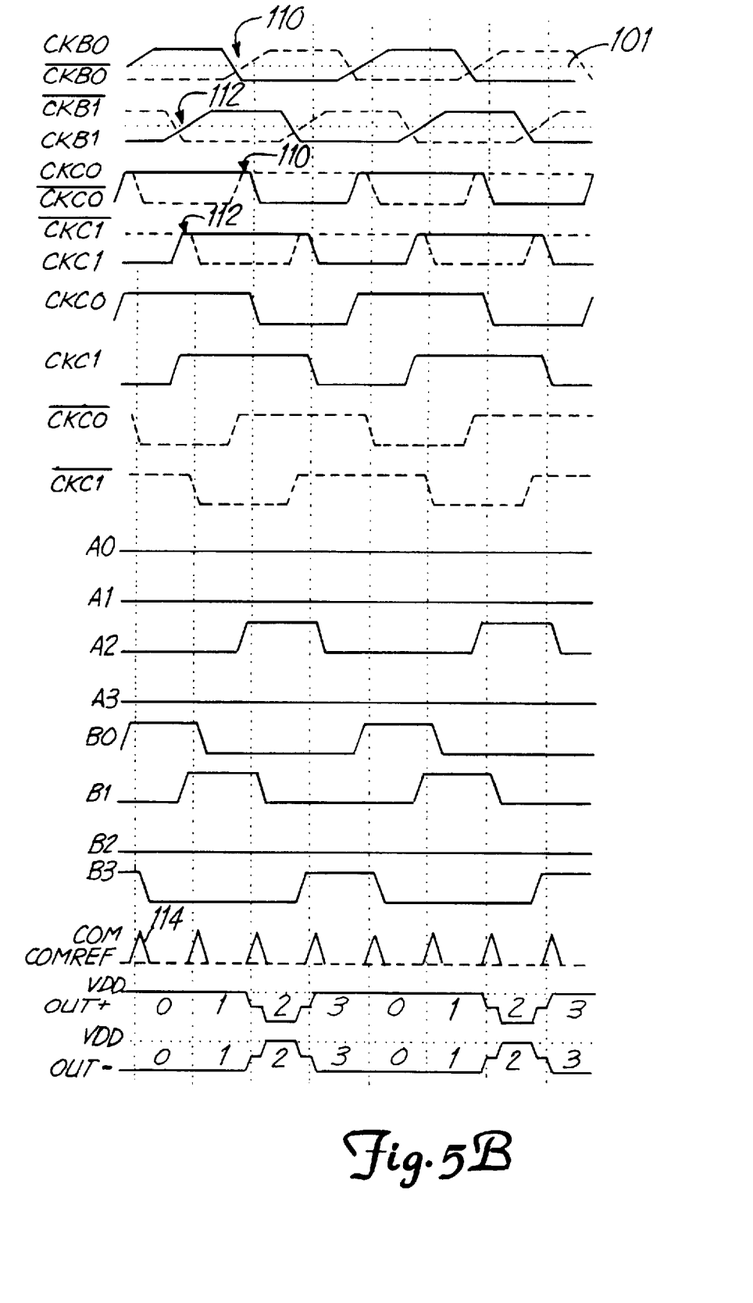
FIG. 5b is a waveform diagram illustrating the waveforms at various nodes in the circuits shown in FIGS. 1–4 when the clocks cross over high.
Figure 5C:
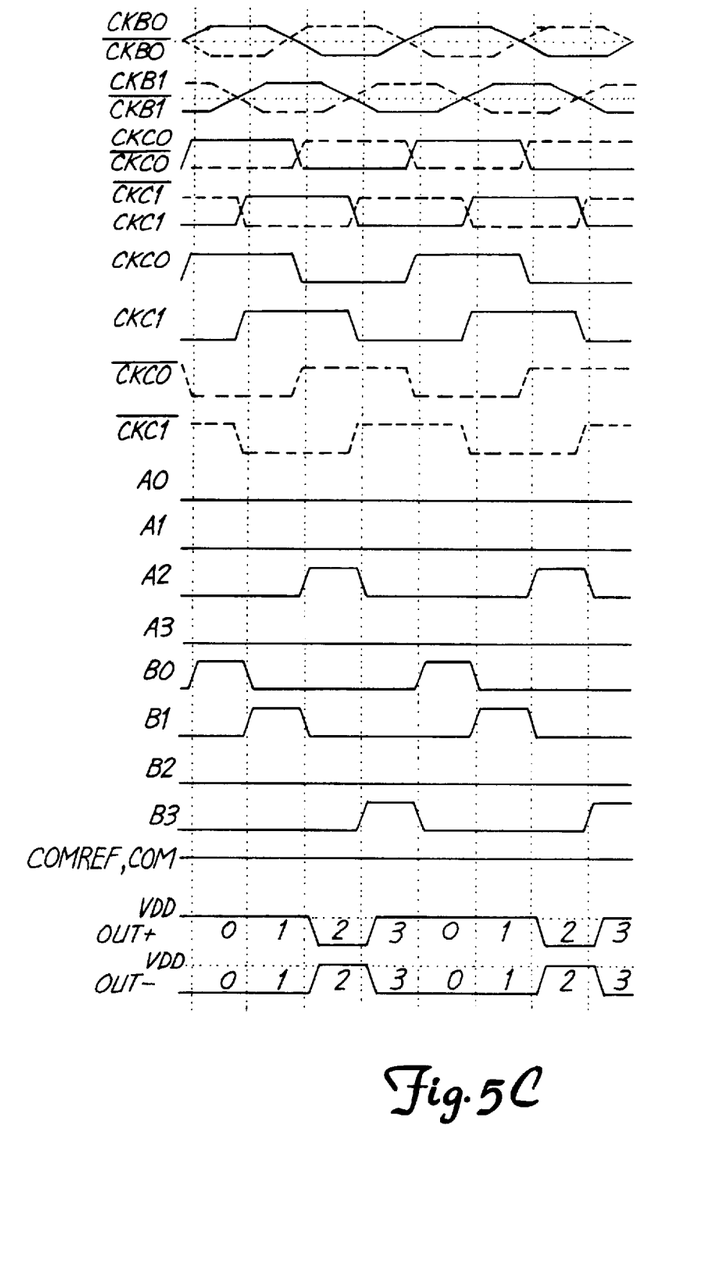
FIG. 5c is a waveform diagram illustrating the waveforms at various nodes in the circuits shown in FIGS. 1–4 when the clocks cross over at an optimum level.

FIGS. 5a–5c are diagrams which show waveforms that result when the select clock signals exhibit high, low and optimum cross-over, respectively. CKB0 and $\overline{\text{CKB0}}$ represent the intermediate select clock signals appearing on nodes CKB and $\overline{\text{CKB}}$ in buffer 54A. CKB1 and $\overline{\text{CKB1}}$ represent the intermediate select clock signals on nodes CKB and $\overline{\text{CKB}}$ in buffer 54B. The true select clock signals are shown in solid lines and the complement select clock signals are shown in dashed lines. At transition 100 in FIG. 5a, CKB0 and $\overline{\text{CKB0}}$ cross over one another as these signals transition from high-to-low and low-to-high, respectively. The signals cross over one another at a level above the optimum level, which is represented by dashed line 102. As a result, the squared and inverted select clock signals CKC0 and $\overline{\text{CKC0}}$ are both logic low at transition 100. The same situation also exists for clock signals CKB1 and $\overline{\text{CKB1}}$, and clock signals CKC1 and $\overline{\text{CKC1}}$. Since the true and complement phases of the select clock signals are both briefly low at each clock transition, there is a brief period during which all of the multiplexer select outputs A0–A3 and B0–B3 are low and thus all of the gating transistors M1A–M4A and M1B–M4B are disabled. As a result, the output voltages on data outputs OUT+ and OUT-briefly go to a logic high level at each bit transition, as shown at 106. The "0", "1", "2" and "3" inserted in the OUT+ and OUT− waveforms represent data inputs D0 (=1), D1(=1), D2(=0) and D3(=1), respectively.

As a result of the low cross-over, the window during which data is valid at the data outputs is narrowed by the time during which the select clock signals cross over high. However, this behavior results in a negative pulse 108 on common node COM at each transition from one bit to the next. This negative pulse 108 causes the average value of the voltage on common node COM to be less than the reference voltage on reference node COMREF. This difference is detected by differential amplifier 30 (shown in FIG. 2), which drives cross-over control output XOVERCTRL high. This results in an increase in the voltage at which the select clock signals cross over one another, until the problem is corrected.

In FIG. 5b, intermediate select clock signals CKB0 and CKB1 cross over low with respect to intermediate select clock signals $\overline{\text{CKB0}}$ and $\overline{\text{CKB1}}$. In this case, the data output waveforms at data outputs OUT+ and OUT− are different from that shown in FIG. 5a, but the result is the same. The window during which data is valid at the data outputs is narrowed by the time during which the clocks cross over high. The voltage on data outputs OUT+ and OUT− is distorted since there is a brief period during each bit transition in which two of the multiplexer select outputs A0–A3 and B0–B3 are high and thus two gating transistors M1A–M4A and M1B–M4B are enabled. However, this behavior also results in a positive pulse 114 in the voltage on common node COM at each bit transition. This positive pulse 114 results in an average value of the voltage on common node COM which is greater that the reference voltage on reference node COMREF. This difference is then detected by differential amplifier 30, which drives cross-over control output XOVERCTRL low until the problem is corrected and the clock cross-over is optimum.

In FIG. 5c, the select clock signals cross over neither high nor low. The voltage on data outputs OUT+ and OUT− transition cleanly from one bit to the next and there is no time during which all of the gating transistors are off (as in FIG. 5a when the select clock signals cross over low) or when two gating transistors are on at the same time (as in FIG. 5b when the select clock signals cross over high). Cross-over adjustment transistors 34 make no further adjustment to the relative cross-over of the select clock signals since the voltages on common node COM and reference node COMREF are equal.

Figure 6:
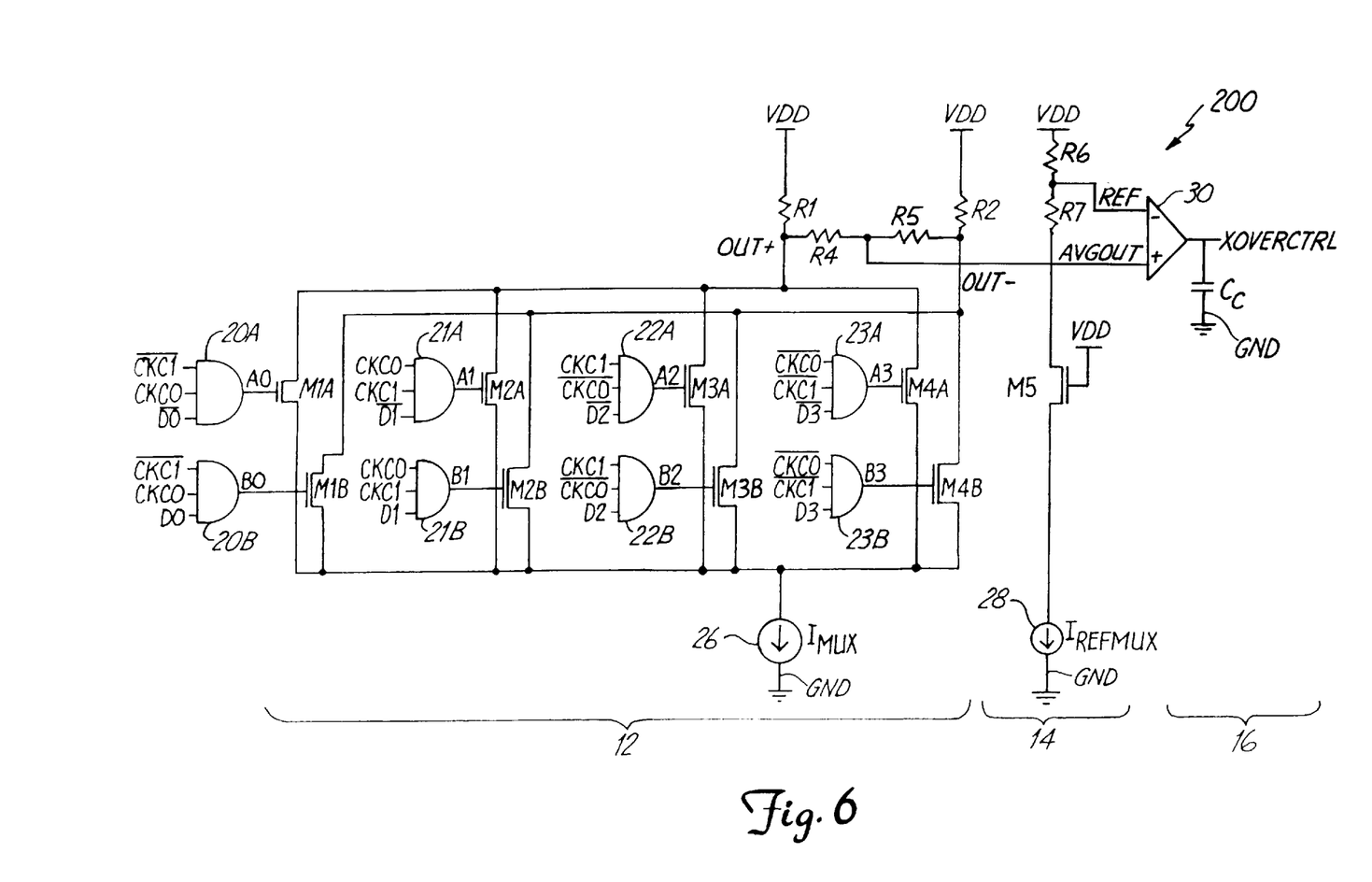
FIG. 6 is a schematic diagram of a time-division data multiplexer according to an alternative embodiment of the present invention.

FIG. 6 is a schematic diagram of a time division data multiplexer according to an alternative embodiment of the present invention. The same reference numerals are used in FIG. 6 as were used in FIG. 1 for the same or similar elements. Time-division data multiplexer 200 further includes measurement resistors R4 and R5 which are coupled together in series between data output OUT+ and data output OUT−. The non-inverting input of differential amplifier 30 is coupled to the AVGOUT node between resistors R4 and R5. The load resistor for reference multiplexer portion 14 includes resistors R6 and R7 which are coupled together in series between supply terminal VDD and the drain of reference transistor MS. The inverting input of differential amplifier 30 is coupled to the REF node between resistors R6 and R7. Resistors R6 and R7 each have a resistance that is preferably one-half of the resistance of resistors R1 and R2. Resistors R4 and R5 preferably have a resistance that is at least 10 times the resistances of resistors R1 and R2. Current sources 26 and 28 preferably have a sufficiently low parallel resistance so that changes in the clock cross-over which results in positive or negative spikes on common node COM results in a change in $I_{MUX}$ and a change in the voltage on AVGOUT. In one embodiment, current sources 26 and 28 are removed entirely, and common node COM and the source of transistor M5 are coupled to supply terminal GND. Differential amplifier 30 compares the voltages on nodes REF and AVGOUT, and adjusts cross-over control output XOVERCTRL to adjust the cross-over of the select clock signals as in the embodiments discussed above.

As in the embodiment discussed with respect to FIG. 1, the reference multiplexer formed by resistors R6 and R7, transistor M5 and current source 28 can be scaled to save power by a factor of N according to Equation 1, except that $R_{REF}$ in Equation 1 is now the resistance of resistor R6 plus the resistance of resistor R7.

Figure 7:
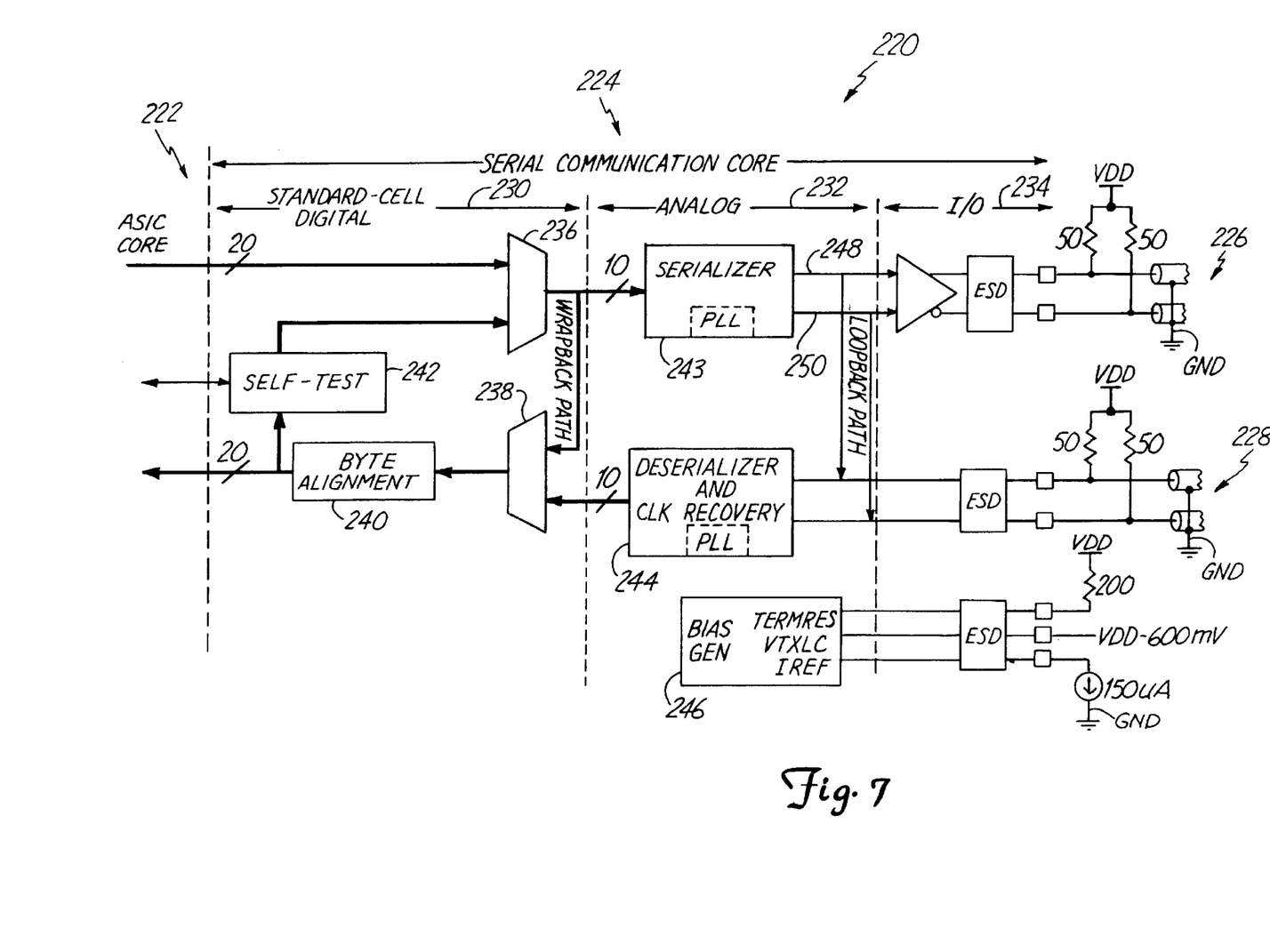
FIG. 7 is a block diagram of an integrated circuit in which the multiplexer of the present invention is useful.

FIG. 7 is a block diagram of an application-specific integrated circuit (ASIC) in which the time-division data multiplexer of the present invention is useful. The present invention is also useful in other applications. ASIC 220 includes and ASIC core 222 and a serial communication core 224. Serial communication core 224 allows ASIC core 222 to transmit and receive serial data over transmission lines 226 and 228. Serial communication core 224 includes a standard-cell digital section 230 for communication with ASIC core 226, an analog section 232 for transmitting and receiving data and an input/output section 234 for communicating with transmission lines 226 and 228. Standard-cell digital section 230 includes multiplexers 236 and 238, byte alignment circuit 240 and self-test circuit 242. Analog section 232 includes serializer 243, deserializer and clock recovery circuit 244 and bias generator 246. The time-division data multiplexer of the present invention is implemented within serializer 243 for serializing parallel data received from multiplexer 236 so that the data can be transmitted over transmission lines 226. Serializer 243 provides the serial data to a differential, open-drain output buffer through outputs 248 and 250, which drives transmission lines 226. Transmission lines 226 are terminated by 50 Ohm resistors. In one embodiment, serializer 243 further includes a pre-emphasis circuit having an emphasis multiplexer which outputs a serial data stream on outputs 248 and 250 that is identical to that of the data multiplexer, except that it is inverted and shifted by one bit period.

Deserializer and clock recovery circuit 244 receives differential, serial data from transmission lines 228 and provides parallel data to multiplexer 238 for transfer to ASIC 222. Deserializer and clock recovery circuit 244 are disclosed in greater detail in U.S. Ser. No. 08/595,854, filed Feb. 2, 1996 and entitled SELF-TIMED PHASE DETECTOR AND METHOD, U.S. Ser. No. 08/595,821, filed Feb. 2, 1996 and entitled HIGH SPEED CAPTURE LATCH, and U.S. Ser. No. 08/596,006, filed Feb. 2, 1996, and entitled SYSTEM AND METHOD FOR HIGH SPEED DATA CAPTURE OF SERIAL DATA STREAM, which are hereby incorporated by reference.

CONCLUSION

The time-division data multiplexer of the present invention provides accurate and optimum control of the cross-over of multi-phase clocks. The cross-over is continuously and automatically adjusted with changes in process, voltage and temperature. The time-division data multiplexer of the present invention is particularly useful as a serializer for driving high speed, serial differential data streams between integrated circuits, such as application specific integrated circuits (ASICs), and may be followed by a subsequent differential output buffer, if desired. Serial data streams pass data at a very high rate from one integrated circuit to the next.

Although the present invention has been described with reference to preferred embodiments, workers skilled in the art will recognize that changes may be made in form and detail without departing from the spirit and scope of the invention. For example, the present invention has been described with reference to a 4:1 time-division multiplexer, but can be implemented as an n:1 time-division multiplexer, where n is any even integer. The number of circuit elements and select clock signals can be scaled up or down as desired to implement a different size multiplexer. Also, any multi-phase clock generator can be used with the present invention. For example, the VCO may generate rail-to-rail CMOS level clock signals directly rather than low-level differential clock signals, in which case the differential-to-CMOS level buffers would not be required. Similarly, a variety of differential-to-CMOS level buffers can be used with the present invention. Individual signals in the time-division multiplexer of the present invention can be active high or low, and corresponding circuitry can be converted to suit a particular convention. The present invention can be implemented with discrete components, digital logic that is embedded in an integrated circuit or a combination of both. The term "coupled" used in the specification and in the claims includes various types of connections or couplings and includes a direct connection or a connection through one or more intermediate components.

What is claimed is:

1. A time-division multiplexer with an adjustable clock cross-over voltage, comprising:

a multi-phase clock generator comprising a plurality of select clock outputs with different phases;

a plurality of data inputs;

first and second data outputs;

a first set of gating transistors which is coupled between the first data output and a common node, with each transistor in the first set being gated by a corresponding data input and at least one corresponding select clock output;

a second set of gating transistors which is coupled between the second data output and the common node, with each transistor in the second set being gated by a corresponding data input and at least one corresponding select clock output;

a first current source coupled to the common node;

a reference voltage generator; and an amplifier comprising a first input coupled to the common node, a second input coupled to the reference voltage generator and a cross-over control output coupled to the plurality of select clock outputs for adjusting cross-over of the select clock outputs.

2. The time-division multiplexer of claim 1 wherein the reference voltage generator comprises:

a reference transistor and a second current source coupled together in series and defining a reference node between the reference transistor and the second current source; and wherein the reference node is coupled to the second input of the amplifier.

3. The time-division multiplexer of claim 2 wherein the reference transistor has a continuously enabled state.

4. The time-division multiplexer of claim 2 and further comprising:

first and second supply terminals;

a first load resistor coupled between the first data output and the first supply terminal;

a second load resistor coupled between the second data output and the first supply terminal;

a third load resistor coupled between the reference transistor and the first supply terminal;

wherein the first current source is coupled between the common node and the second supply terminal; and wherein the second current source is coupled between the reference node and the second supply terminal.

5. The time-division multiplexer of claim 4 wherein:

the first, second and third load resistors have equal resistances;

the first and second sets of transistors and the reference transistor have equal gate widths and lengths; and the first and second current sources supply equal currents.

6. The time-division multiplexer of claim 4 wherein:

the first and second load resistors have a resistance R;

the first and second sets of transistors have a gate width W;

the first current source supplies a tail current $I_{MUX}$ to the common node;

the third load resistor has a resistance R*N;

the reference transistor has a gate width W/N;

the reference transistor and the first and second sets of transistors have a gate length L;

the second current source supplies a tail current $I_{MUX}/N$ to the reference node; and N is a selected variable.

7. The time-division multiplexer of claim 1 wherein the multi-phase clock generator comprises:

a voltage-controlled oscillator comprising a plurality of differential, voltage-controlled delay elements coupled together in a ring, wherein each delay element has a differential input coupled to a differential output of another delay element in the ring; and a differential-to-CMOS level buffer having a differential input coupled to the differential output of a corresponding delay element and having first and second complementary logic outputs which drive respective select clock outputs.

8. The time-division multiplexer of claim 7 and further comprising:

a first, relatively positive supply terminal and a second, relatively negative supply terminal;

a first N-channel cross-over adjustment transistor coupled between the first output of the differential-to-CMOS level buffer and the second supply terminal and having a control terminal coupled to the cross-over control output; and a second N-channel cross-over adjustment transistor coupled between the second output of the differential-to-CMOS level buffer and the second supply terminal and having a control terminal coupled to the cross-over control output.

9. The time-division multiplexer of claim 8 wherein the differential-to-CMOS level buffer further comprises first and second inverters coupled between the first and second complementary logic outputs, respectively, and the respective select clock outputs.

10. The time-division multiplexer of claim 9 wherein the amplifier comprises a differential amplifier having an inverting input coupled to the common node and a non-inverting input coupled to the reference voltage generator.

11. The time-division multiplexer of claim 9 wherein the differential-to-CMOS level buffer comprises a plurality of transistors which have gate widths that are sized such that the respective select clock outputs cross over one another at a voltage which is lower than an optimum voltage.

12. The time-division multiplexer of claim 7 and further comprising:

a first, relatively positive supply terminal and a second, relatively negative supply terminal;

a first P-channel cross-over adjustment transistor coupled between the first output of the differential-to-CMOS level buffer and the first supply terminal and having a control terminal coupled to the cross-over control output; and a second P-channel cross-over adjustment transistor coupled between the second output of the differential-to-CMOS level buffer and the first supply terminal and having a control terminal coupled to the cross-over control output.

13. The time-division multiplexer of claim 12 wherein the differential-to-CMOS level buffer further comprises first and second inverters coupled between the first and second complementary logic outputs, respectively, and the respective select clock outputs and comprises a plurality of transistors which have gate widths that are sized such that the respective select clock outputs cross over one another at a voltage which is higher than an optimum voltage.

14. The time-division multiplexer of claim 13 wherein the amplifier comprises a differential amplifier having a non-inverting input coupled to the common node and an inverting input coupled to the reference voltage generator.

15. The time-division multiplexer of claim 1 and further comprising a loop filter coupled to the cross-over control output.

16. An n:1 time-division multiplexer, where n is an even integer, the multiplexer comprising:

clock generator means for generating n/2 pairs of select clock signals, wherein the select clock signals in each pair are approximately 180 degrees out of phase with one another and have an adjustable cross-over voltage, and wherein the n select clock signals are equally distributed in phase over 360 degrees;

a set of n true and complement data inputs; first and second data outputs;

a first set of n gating transistors coupled between the first data output and a common node, with each transistor in the first set being gated by a corresponding true data input and corresponding select clock signals;

a second set of n gating transistors coupled between the second data output and the common node, with each transistor in the second set being gated by a corresponding complement data input and the corresponding select clock signals;

first current source means for supplying a tail current to the common node;

reference means for generating a reference voltage on a reference node which is representative of a voltage on the common node when only one of the transistors in the n pairs of data gating transistors is enabled at one time;

means for comparing the voltages on the reference node and the common node and for generating a cross-over control output which is representative of the comparison; and means for adjusting the cross-over voltage of the select clock outputs as a function of the cross-over control output.

17. A time-division multiplexer comprising: first and second supply terminals;

a multi-phase clock generator comprising a plurality of select clock outputs with different phases;

a set of true and complement data inputs;

first and second data outputs;

a first set of gating transistors coupled between the first data output and a common node, with each transistor in the first set being gated by a corresponding true data input and at least one corresponding select clock output;

a second set of gating transistors coupled between the second data output and the common node, with each transistor in the second set being gated by a corresponding complement data input and at least one corresponding select clock output;

reference means for generating a reference voltage which is representative of an average of the voltages on the first and second data outputs when only one of the transistors in the first and second sets is enabled;

means for comparing the average of the voltages on the first and second data outputs with the reference voltage and for generating a cross-over control output which is representative of the comparison; and means for adjusting the cross-over voltage of the select clock outputs as a function of the cross-over control output.

18. The time-division multiplexer of claim 17 and further comprising:

first and second termination resistors coupled between the first supply terminal and the first and second data outputs, respectively;

first and second measurement resistors coupled in series between the first and second data outputs;

wherein the reference means comprises third and fourth termination resistors and a reference transistor coupled together in series between the first and second supply terminals;

wherein the comparison means comprises a differential amplifier having a non-inverting input coupled to a node between the first and second measurement resistors, an inverting input coupled to a node between the third and fourth termination resistors, and an output which forms the cross-over control output; and wherein the means for adjusting the cross-over voltage comprises a transistor coupled between each select clock output and the second supply terminal and having a control terminal coupled to the cross-over control output.

19. The time-division multiplexer of claim 18 wherein the first and second termination resistors each have a resistance R and the third and fourth termination resistors each have a resistance R/2.

20. A method of serializing a plurality of parallel data inputs to a pair of data outputs, comprising:

generating at least one pair of select clock signals which are approximately 180 degrees out of phase with one another;

selectively coupling the data outputs to a common node as a function of the plurality of data inputs and the select clock signals;

comparing the voltage on the common node with a reference voltage; and adjusting cross-over of the select clock signals as a function of the comparison.

* * * * *